(12) United States Patent
Zhu

(10) Patent No.: US 10,483,412 B2
(45) Date of Patent: Nov. 19, 2019

(54) HIGH EFFICIENCY LOCAL BACK ELECTRODE ALUMINUM PASTE FOR CRYSTALLINE SILICON SOLAR CELLS AND ITS APPLICATION IN PERC CELLS

(71) Applicant: NANTONG T-SUN NEW ENERGY CO., LTD., Nantong (CN)

(72) Inventor: Peng Zhu, Nantong (CN)

(73) Assignee: NANTONG T-SUN NEW ENERGY CO., LTD., Nantong (CN)

( * ) Notice: Subject to any disclaimer, the term of this patent is extended or adjusted under 35 U.S.C. 154(b) by 189 days.

(21) Appl. No.: 15/536,698

(22) PCT Filed: Jul. 25, 2016

(86) PCT No.: PCT/CN2016/091502
§ 371 (c)(1),
(2) Date: Jun. 16, 2017

(87) PCT Pub. No.: WO2018/006449
PCT Pub. Date: Jan. 11, 2018

(65) Prior Publication Data
US 2019/0006539 A1    Jan. 3, 2019

(30) Foreign Application Priority Data
Jul. 8, 2016  (CN) .......................... 2016 1 0535116

(51) Int. Cl.
*H01L 31/02*     (2006.01)
*H01L 31/0224*   (2006.01)
*H01B 1/22*      (2006.01)
*H01L 31/0216*   (2014.01)
*H01L 31/18*     (2006.01)

(52) U.S. Cl.
CPC ....... *H01L 31/022441* (2013.01); *H01B 1/22* (2013.01); *H01L 31/02167* (2013.01); *H01L 31/1868* (2013.01)

(58) Field of Classification Search
None
See application file for complete search history.

(56) References Cited

FOREIGN PATENT DOCUMENTS

| CN | 202585431 | 12/2012 | |
|---|---|---|---|
| CN | 103531265 | 1/2014 | |
| CN | 103762249 | 4/2014 | |
| WO | WO-2013109583 A2 * | 7/2013 | ............... H01B 1/16 |

* cited by examiner

*Primary Examiner* — Bradley Smith
(74) *Attorney, Agent, or Firm* — Rankin, Hill & Clark LLP

(57) ABSTRACT

A high-efficiency back electrode local aluminum paste crystalline silicon solar cell is composed of the following components proportioned to weights: 70-85 of parts powder, 1-30 parts of organic carrier, 0.1-10 parts of inorganic binder, 0.1-1 parts of auxiliary conductive additives. The aluminum paste is mainly used to manufacture the passivated emitter and back electrode of silicon solar cell with dot or linear contact on rear surface. PERC aluminum paste printed on the passivated film of the silicon wafer with dot-opening or linear-opening is dried and sintered.

8 Claims, No Drawings

HIGH EFFICIENCY LOCAL BACK ELECTRODE ALUMINUM PASTE FOR CRYSTALLINE SILICON SOLAR CELLS AND ITS APPLICATION IN PERC CELLS

TECHNICAL FIELD

This invention is involved in the scope of solar cells, in particular, of an high efficiency back electrode local aluminum paste for crystalline silicon solar cells and its application in PERC cells.

BACKGROUND TECHNOLOGY

At present, reduction of the cost for crystalline silicon is one of the targets aspired after in the photovoltaic industry, where the competition is increasingly fierce. To lower the silicon raw material cost generally needs a development towards the direction of thinner silicon wafers, that is: using thinner silicon wafers is one of the future developing trends of crystal silicon solar cell industry.

When the minority carrier diffusion length is greater than the thickness of silicon wafer, the composite velocity on cells' both surfaces is becoming more and more important. To improve the quality of surface passivation and to reduce the surface composite velocity has become one of the main means to improve the efficiency of the cells. The aluminum back electrode can effectively reduce the back surface composite velocity and improve the conversion efficiency, which is a major back surface passivation structure generally used for commercial crystalline silicon solar cells.

Compared with the ordinary cells, the back passivated cells have passivated film on the surface to reduce the carrier composite and to improve the conversion efficiency; also it can improve the contact to reduce the contact resistance and increase the shunt resistance; in addition, it also has an effect of reduction of reflection.

When a passivation film is formed on the cell back surface, in order to allow the aluminum paste printing on the back electrode for better ohmic contact with solar cell substrate and better collection of electric current, a preparation process becomes available: ① the laser drilling method, the DuPont USA has developed a few kinds of paste incorporating this technology. ™Solamet® PV36x series new aluminum paste technology applied to the Rear-side Passivation of crystal silicon photovoltaic cell has successfully achieved 20.3% for conversion efficiency in cells. Higher conversion efficiency represents more power output. However, this technology requires an additional set of equipment plus complex processing, which would result in high cost. ② Chemical etching method, mainly using silicon paste on the composite passivated film to screen-print the silicon paste film with dot-contact pattern before etching by chemical liquid to remove the portions not covered by silicon paste film on the composite passivated film. MOK GmbH of Germany supplies the corresponding etching reagent. However, the disadvantage of chemical etching is that it can cause pollution.

The screen printing method for preparing strip-shaped local contact and back dot contact reveals that in the normal sintering condition, the aluminum paste is difficult to penetrate the silicon nitride film, and the aluminum alloy paste as formed therefrom is very poor with respect to ohmic contact causing current leakage increase. Since the silicon nitride film contains great density of positive electric charge, the formation of the inversion film will reduce short-circuit current and filling factor, and the scanning of this cell structure for series and shunt resistance demonstrates a big difference from the standard value. In case of using the method of etching paste for preparation of back contact, the electric performance parameters are a little bit improved. These research results has a notable significance to the production process for the solar cells.

The patent numbered [CN102667961A] discloses a aluminum paste to form aluminium back electrode in PERC silicon solar cell and its preparation method, which is used in the production of PERC silicon solar cells to improve electric efficiency with a good effect on the binding between the sintered aluminum paste and the back perforated passivation film, and the PERC silicon solar cell produced using aluminum paste under this invention has a longer service life and durability. However, there is still an small escape of Al—Si alloy from the perforation on the silicon wafer passivation film of the back surface during the sintering process, where the aluminum paste is printed on the back side with a perforated medium passivation film.

The Chinese patent numbered [CN101720512B] discloses a method for back contact on local back electrode, which uses screen printed local back electrode to form a high quality back contact, therefore, this will involve a provision of a back surface passivation and formation of back or rear contact featured with optical limit. However, after the back surface passivation, a perforation is still needed by chemical or laser way before aluminum paste printing to obtain the back dot contact after sintering.

The Chinese patent numbered [CN101540350B] discloses a preparation method for crystalline silicon solar cell, which is relating a preparation process of a rear dot contact crystalline silicon solar cells, forming a composite passivation film by thermal oxidation of silicon dioxide and silicon nitride plating on the wafer back, and on the composite passivation film, the silicon paste screen printing is applied to print silicon paste film of dot contact pattern, then the chemical etching liquid is used to remove the portions not covered by silicon paste film on the composite passivation film, also an aluminum paste film is printed on the silicon wafer back by screen printing and a silicon plus aluminum alloy film is formed between the silicon paste film and the aluminum paste film by sintering, finally the sintering results in a local ohmic contact and local aluminum back electrode between aluminum paste film and silicon base of silicon wafer back side. The preparation process using this method reduces the preparation cost, and mass production is easily realized in this way, the crystalline silicon solar cell with prepared backside dot contact electrode may have good back ohmic contact and local aluminum back electrode, it would reduce the increase of the series resistance caused by dot contact to some extent, thus maintaining a good backside passivation effect and optical back emission.

The Chinese patent numbered [CN202585431U] discloses an optical cell structure with back passivation, relating to a photo-voltaic cell structure with back passivation: back passivation film covering the backside of the solar cell, slotting on the back passivation film with slots orthogonal to each other to constitute a grid on the back passivation film, and the aluminum paste covering the slots on the back passive film, but not entirely covered. The aluminum paste sintering results in a local back electrode structure. The result shows the benefits of: ① reduction of the cell's series resistance, improvement of the filling factor and the cell conversion efficiency; ② improvement of the cell warpage thus the cells are flatter.

To sum up, in view of the domestic and foreign customers' requirement for performance of photo-voltaic cell structure with back passivation, the following shall be included: ①The longer service life; ② higher conversion efficiency; ③ lower contact resistance, high shunt resistance; ④ good reduction of reflection. No patent relating with above requirements is reported.

SUMMARY OF THE INVENTION

The purpose of the invention: the invention is to provide a high efficient back electrode local aluminum paste for crystalline silicon solar cell and its application in the PERC cell. The main characteristics of the aluminum paste are good workability in printing, minor injury to the passivation film, good ohmic contact at the local contact to reduce the current leakage.

Technical scheme: in order to achieve the above purpose, the technical scheme of the invention is to provide a highly efficient back electrode local aluminum paste for crystalline silicon solar cell, and the said highly efficient back electrode local aluminum paste for crystalline silicon solar cell is composed of the following components proportioned to weights: 70-85 parts for aluminum powder, 1-30 parts for organic carrier, 0.1-10 parts for inorganic binder, 0.1-1 parts for auxiliary conductive additive.

As an optimization: the said aluminum powder shall comprise at least one or more kinds of alloy powder, the said alloy powder shall be one or more of the following: aluminum and zinc alloy powder, aluminum and magnesium alloy powder, aluminum and silicon alloy powder, silver and aluminum alloy powder. The added alloy powder shall be 1-30% the content of the aluminum powder as added, and the aluminum particle size shall be 1-11 um.

As an optimization: the said organic carrier shall be composed of macromolecules polymer and organic solvent mixed together, the said macromolecules polymer is proportioned as 1-30%, and the said macromolecular polymer is referring to one or more of xylene resin, vinyl acetate acrylate cellulose, cellulose acetate butyrate, acrylic acid resin, nitro cellulose; and the said organic solvent is one or more of terpineol, alcohol ester 12, butyl carbitol and butyl carbitol acetate.

As an optimization: the inorganic binder comprises the following components proportioned to weights: 10-20 parts for $Bi_2O_3$, 15-25 parts for $B_2O_3$, 2-4 parts for $SiO_2$, 20-70 parts for PbO, 1-15 parts for ZnO. All the above are processed to obtain an inorganic binder of D50 in diameter of 0.8-3 micron.

As an optimization, the auxiliary conductive additive is one or more of graphene, copper powder and zinc powder The application of the said high efficiency local back electrode aluminum paste for crystalline silicon solar cell applied in the PERC cell includes the following steps:
(1) To provide passivation film, the said passivation film has a medium of passivation film about 30-60 um in width and 5-20 um in depth on the backside;
(2) On the said medium of passivated film, a back electrode aluminum paste is applied by 400 mesh screen printing on the back passivated film of 156 mm×156 mm monocrystalline silicon wafer to form a back electrode film;
(3) By using an oven, the said aluminum paste is dried through 250° C. Afterwards, the aluminum electrode film has no peel-off, then the sintering process is conducted up to peak temperature of 700-800° C. to form a local BSF film at the said linear opening of the medium of the passivated film.

The beneficial effect: the invention has a good fluidity, little damage to the passivation film, and the BSF film is homogeneous and dense, namely the highly efficient and well locally filled back electrode local contact aluminum paste for crystalline silicon solar cell, and the massive production using this invention applied to the passivated crystal silicon solar cell with linear-opening has an average conversion efficiency of more than 20.7%, which is specially used for PERC silicon solar cell with back electrode local contact aluminum paste and its preparing method.

SPECIFIC IMPLEMENTATION METHODS

The present invention is described in detail with the following specific practical examples:

Practical Example 1

A kind of high efficiency back electrode local aluminum paste for crystalline silicon solar cell, and the said high efficiency back electrode aluminum paste for crystalline silicon solar cell is composed of the following components proportioned to weights: 70 parts for aluminum powder, 1 part for organic carrier, 0.1 part for inorganic binder, 0.1 part for auxiliary conductive additive.

The said aluminum powder shall comprise at least one or more kinds of alloy powders, the said alloy powder shall be one or more of the following: aluminum and zinc alloy powder, aluminum and magnesium alloy powder, aluminum and silicon alloy powder, silver and aluminum alloy powder. The added alloy powder of the above is 1% the content of the aluminum powder, and the aluminum particle size is 1 um.

The said organic carrier shall be composed of macromolecules polymer and organic solvent mixed together, the said macromolecules polymer is proportioned as 1%, and the said macromolecular polymer is referring to one or more of xylene resin, vinyl acetate acrylate cellulose, cellulose acetate butyrate, acrylic acid resin, nitro cellulose; and the said organic solvent is one or more of terpineol, alcohol ester 12, butyl carbitol and butyl carbitol acetate.

The said inorganic binder comprises the following components proportioned to weights: 10 parts for $Bi_2O_3$, 15 parts for $B_2O_3$, 2 parts for $SiO_2$, 20 parts for PbO, 1 part for ZnO. All the above are processed to obtain an inorganic binder of D50 in 0.8 micron.

The said auxiliary conductive additive is one or more kinds of graphene, copper powder and zinc powder.

The application of the said local back electrode aluminum paste for high efficiency crystalline silicon solar cell in the PERC cell includes the following steps:
(1) To provide the passivation film, the said passivation film has a medium of passivation film with linear opening of about 30 um in width and of about 5 um in depth on the backside;
(2) On the said medium of passiavated film, a back electrode aluminum paste is applied by 400 mesh screen printing on the back passivated film of 156 mm×156 mm monocrystalline silicon wafer to form a back electrode film;
(3) By using an oven, the said aluminum paste is dried through 250° C. Afterwards, the aluminum electrode film has no peel-off, then the sintering process is conducted up to peak temperature of 700-800° C. to form a local BSF film at the said linear opening of the medium of the passivated film.

Practical Example 2

A kind of high efficiency local back electrode aluminum paste for crystalline silicon solar cell, the said high efficiency local back electrode aluminum paste for crystalline silicon solar cell is composed of the following components proportioned to weights: 85 parts for powder, 30 parts for organic carrier, 10 parts for inorganic binder, and 1 part for the auxiliary conductive additive.

11 um. The said aluminum powder shall comprise at least one or more kinds of alloy powders, the said alloy powder shall be one or more of the following: aluminum and zinc alloy powder, aluminum and magnesium alloy powder, aluminum and silicone alloy power, silver and aluminum alloy powder. The added alloy powder of the above is 30% the content of the aluminum powder, and the aluminum particle size is 11 um.

The said organic carrier shall be composed of macromolecules polymer and organic solvent mixed together, the said macromolecules polymer is proportioned as 30%, and the said macromolecular polymer is referring to one or more of xylene resin, vinyl acetate acrylate cellulose, cellulose acetate butyrate, acrylic acid resin, nitro cellulose; and the said organic solvent is one or more of terpineol, alcohol ester 12, butyl carbitol and butyl carbitol acetate.

The said inorganic binder comprises the following components proportioned to weights: 20 parts for $Bi_2O_3$, 25 parts for $B_2O_3$, 4 parts for $SiO_2$, 70 parts for PbO, 15 parts for ZnO. All the above are processed to obtain an inorganic binder of D50 in 3 micron.

The said auxiliary conductive additive is one or more kinds of graphene, copper powder and zinc powder.

The application of the said high efficiency local back electrode aluminum paste for crystalline silicon solar cell in the PERC cell includes the following steps:
(1) To provide the passivation film, the said passivation film has a medium of passivation film with linear opening about 60 um in width and 20 um in depth on the back;
(2) On the said medium of passiavated film, a back electrode aluminum paste is applied by 400 mesh screen printing on the back passivated film of 156 mm×156 mm monocrystalline silicon wafer to form a back electrode film;
(3) By using an oven, the said aluminum paste is dried through 250° C. Afterwards, the aluminum electrode film has no peel-off, then the sintering process is conducted up to peak temperature of 800° C. to form a local BSF film at the said linear opening of the medium of passivated film.

Practical Example 3

A kind of high efficiency back electrode local aluminum paste for crystalline silicon solar cell, and the said high efficiency back electrode aluminum paste for crystalline silicon solar cell is composed of the following components proportioned to weights: 78 parts for aluminum powder, 22 parts for organic carrier, 6 parts for inorganic binder, 0.4 part for auxiliary conductive additive.

The said aluminum powder shall comprise at least one or more kinds of alloy powders, the said alloy powder shall be one or more of the following: aluminum and zinc alloy powder, aluminum and magnesium alloy powder, aluminum and silicon alloy power, silver and aluminum alloy powder. The added alloy powder of the above shall be 13% the content of the aluminum powder, and the aluminum particle size shall be 6 um.

The said organic carrier shall be composed of macromolecules polymer and organic solvent mixed together, the said macromolecules polymer is proportioned as 21%, and the said macromolecular polymer is referring to one or more of xylene resin, vinyl acetate acrylate cellulose, cellulose acetate butyrate, acrylic acid resin, nitro cellulose; and the said organic solvent is one or more of terpineol, alcohol ester 12, butyl carbitol and butyl carbitol acetate.

The said inorganic binder comprises the following components proportioned to weights: 14 parts for $Bi_2O_3$, 17 parts for $B_2O_3$, 3 parts for $SiO_2$, 50 parts for PbO, 9 parts for ZnO. All the above are processed to obtain an inorganic binder of D50 in 2 micron.

The said auxiliary conductive additive is one or more kinds of graphene, copper powder and zinc powder.

The application of the said local back electrode aluminum paste for high efficiency crystalline silicon solar cell in the PERC cell includes the following steps:
(1) To provide the passivation film, the said passivation film has a medium of passivation film with linear opening in width of about 50 um and in depth of 16 um on the back;
(2) On the said medium of passiavated film, a back electrode aluminum paste is applied by 400 mesh screen printing on the back passivated film of 156 mm×156 mm monocrystalline silicon wafer to form a back electrode film;
(3) By using an oven, the said aluminum paste is dried through 250° C. Afterwards, the aluminum electrode film has no peel-off, then the sintering process is conducted up to peak temperature of 730° C. to form a local BSF film at the said linear opening of the medium passivated film.

The invention is a highly efficient and locally contacting back electrode aluminum paste characterized with good fluidity, little damage to the passivation film, and homogeneous and dense BSF film, and well local filling applied to crystalline silicon solar cell, and the massive production using this invention applied to the passivated crystal silicon solar cell with linear-opening has an average conversion efficiency of more than 20.7%, which is specially used for PERC silicon solar cell with back electrode local aluminum paste, and its preparing method.

The invention is not limited to the above optimized practical examples, anyone can obtain other forms of the products under the inspiration of this invention. No matter how the shape or the structure of the products changes, any technical scheme identical or similar to this application shall fall into the protected scope of this invention.

The invention claimed is:
1. A high efficiency back electrode local aluminum paste for crystalline silicon solar cells comprising the following components proportioned to weights:
    70-85 parts for aluminum powder,
    1-30 parts for organic carrier,
    0.1-10 parts for inorganic binder, and
    0.1-1 parts for auxiliary conductive additive including graphene.
2. The high efficiency back electrode local aluminum paste for crystalline silicon solar cells according to claim 1, wherein the aluminum powder includes at least one or more types of alloy powders, and the alloy powder is one or more of the following: Al+Zn alloy powder, Al+Mg alloy powder, Al+Si alloy powder, Ag+Al alloy powder, and the added other alloy powder is 1-30% the aluminum content, while the granularity of aluminum is 1-11 um.
3. The high efficiency back electrode local aluminum paste for crystalline silicon solar cells according to claim 1, wherein the organic carrier comprises macromolecule polymer and organic solvent mixed together, and the macromolecule polymer is proportioned as 1-30%, which is one or more of xylene resin, vinyl acetate acrylate cellulose, cellulose acetate butyrate, acrylic acid resin, nitro cellulose; and the organic solvent is one or more of terpineol, alcohol ester 12, butyl carbitol and butyl carbitol acetate.

4. The high efficiency back electrode local aluminum paste for crystalline silicon solar cells according to claim 1, wherein the inorganic binder comprises the following components proportioned to weights: $Bi_2O_3$: 10-20 parts, $B_2O_3$: 15-25 parts, $SiO_2$: 2-4 parts, PbO: 20-70 parts, ZnO: 1-15 parts, wherein each is processed to produce an inorganic binder of particle size D50 from 0.8 to 3 microns.

5. The high efficiency back electrode local aluminum paste for crystalline silicon solar cells according to claim 1, wherein the auxiliary conductive additive further includes one or more of copper powder and zinc powder.

6. A method of applying the high efficiency back electrode local aluminum paste for crystalline silicon solar cells according to claim 1 to PERC cells, the method comprising:
   (1) providing a passivation film having a rear surface of passivated film with a linear opening of about 30-60 um in width and about 5-20 um in depth;
   (2) applying the high efficiency back electrode local aluminum paste for crystalline silicon solar cells according to claim 1 by 400 mesh screen printing on the passivated film of 156 mm×156 mm monocrystalline silicon wafer to form a back electrode film;
   (3) using an oven to dry the aluminum paste at 250° C., then sintering up to a peak temperature of 700-800° C. to form a local BSF film at the linear opening of the passivated film.

7. The high efficiency back electrode local aluminum paste for crystalline silicon solar cells according to claim 1 comprising the following components proportioned by weight:
   70-85 parts of the aluminum powder,
   1 part of the organic carrier,
   0.1 parts of the inorganic binder, and
   0.1 parts of the auxiliary conductive additive.

8. A high efficiency back electrode local aluminum paste for crystalline silicon solar cells comprising the following components proportioned by weight:
   70-85 parts for aluminum powder,
   1-30 parts for organic carrier,
   0.1-10 parts for inorganic binder, and
   0.1-1 parts for auxiliary conductive additive including graphene
   wherein the organic carrier comprises a mixture of a macromolecule polymer and an organic solvent;
   wherein the macromolecule polymer is proportioned as 1-30%, and includes vinyl acetate acrylate cellulose, cellulose acetate butyrate, or combinations thereof; and
   wherein the organic solvent includes alcohol ester 12, butyl carbitol, or combinations thereof.

* * * * *